(12) United States Patent
Chen et al.

(10) Patent No.: US 9,421,644 B2
(45) Date of Patent: Aug. 23, 2016

(54) SOLDERING STRUCTURE AND PROCESS OF MAKING THE SAME

(71) Applicant: CHUNG YUAN CHRISTIAN UNIVERSITY, Tao-Yuan (TW)

(72) Inventors: Chih-Chi Chen, Tao-Yuan (TW); Yuan-Kai Liang, Tao-Yuan (TW)

(73) Assignee: CHUNG YUAN CHRISTIAN UNIVERSITY, Tao-Yuan (TW)

( * ) Notice: Subject to any disclaimer, the term of this patent is extended or adjusted under 35 U.S.C. 154(b) by 0 days.

(21) Appl. No.: 14/607,848

(22) Filed: Jan. 28, 2015

(65) Prior Publication Data

US 2016/0175989 A1 Jun. 23, 2016

(30) Foreign Application Priority Data

Dec. 19, 2014 (TW) .............................. 103144560 A

(51) Int. Cl.
| | |
|---|---|
| B23K 35/00 | (2006.01) |
| B23K 35/22 | (2006.01) |
| H05K 3/34 | (2006.01) |
| B32B 15/01 | (2006.01) |
| B32B 15/04 | (2006.01) |
| C23C 10/00 | (2006.01) |
| C23C 28/00 | (2006.01) |

(Continued)

(52) U.S. Cl.
CPC ........... *B23K 35/001* (2013.01); *B23K 35/0238* (2013.01); *B23K 35/262* (2013.01); *B23K 35/3046* (2013.01); *B32B 15/01* (2013.01); *B32B 15/043* (2013.01); *C22C 19/07* (2013.01); *C23C 10/28* (2013.01); *C23C 10/60* (2013.01); *C23C 26/00* (2013.01); *C23C 26/02* (2013.01); *C23C 28/00* (2013.01); *C23C 28/021* (2013.01); *C23C 28/023* (2013.01); *C23C 30/00* (2013.01); *C23C 30/005* (2013.01); *H05K 3/34* (2013.01); *H05K 3/3457* (2013.01); *B23K 2201/36* (2013.01); *B23K 2201/38* (2013.01); *B23K 2201/40* (2013.01); *B23K 2201/42* (2013.01); *Y10T 428/1291* (2015.01); *Y10T 428/12708* (2015.01); *Y10T 428/12715* (2015.01); *Y10T 428/12722* (2015.01); *Y10T 428/12903* (2015.01); *Y10T 428/12917* (2015.01); *Y10T 428/12931* (2015.01); *Y10T 428/12937* (2015.01); *Y10T 428/24975* (2015.01); *Y10T 428/265* (2015.01)

(58) Field of Classification Search
CPC ........ C22C 19/07; C23C 10/28; C23C 10/60; C23C 26/00; C23C 26/02; C23C 28/00; C23C 28/021; C23C 28/023; C23C 30/00; C23C 30/005; B32B 15/01; B32B 15/043; B32B 15/18; B32B 2457/00; B32B 2457/08; B32B 2457/14; B32B 2457/18; B32B 2457/20; B32B 2457/202; B32B 2457/204; B32B 2457/208; Y10T 428/24975; Y10T 428/265; Y10T 428/12708; Y10T 428/12715; Y10T 428/12722; Y10T 428/12903; Y10T 428/1291; Y10T 428/12917; Y10T 428/12931; Y10T 428/12937

See application file for complete search history.

(56) References Cited

U.S. PATENT DOCUMENTS

2014/0065440 A1* 3/2014 Tsuru ....................... C25D 5/12
428/647

*Primary Examiner* — Michael E La Villa
(74) *Attorney, Agent, or Firm* — WPAT, PC; Justin King

(57) ABSTRACT

The invention discloses a soldering structure and process of making the same. The soldering structure comprises: a solder, a Sn—Co—Fe intermetallic compound having a thickness less than 10 μm and a diffusion barrier layer. The process of making the soldering structure is to react the solder containing Sn with an alloy consisting of 85~95 wt % of Co and 5~15 wt % of Fe at the temperature between 250 and 300° C.

14 Claims, 6 Drawing Sheets

(51) Int. Cl.

| | |
|---|---|
| *C23C 28/02* | (2006.01) |
| *C23C 30/00* | (2006.01) |
| *B23K 35/26* | (2006.01) |
| *B23K 35/30* | (2006.01) |
| *B23K 35/02* | (2006.01) |
| *C23C 10/28* | (2006.01) |
| *C23C 10/60* | (2006.01) |
| *C22C 19/07* | (2006.01) |
| *C23C 26/00* | (2006.01) |
| *C23C 26/02* | (2006.01) |

SOLDERING STRUCTURE AND PROCESS OF MAKING THE SAME

BACKGROUND OF THE INVENTION

1. Field of the Invention

This invention relates to the field of a soldering structure, and more particularly, to the soldering structure containing a Sn—Co—Fe intermetallic compound layer having a thickness less than 10 μm.

2. Description of the Prior Art

In general, Co is effective in blocking Cu diffusion and capable of being the potential diffusion barrier layer material in flip chip packaging. However, its reaction with solders is much intense. The fast reaction rate between solders and Co based diffusion barrier layers result in thicker intermetallic compounds. The disadvantage of the soldering structures having a thicker intermetallic compound is that too thick intermetallic compound is detrimental to the soldering structure or soldering joints. Hence, it is important to reduce the reaction rate between solders and Co based diffusion barrier layers.

Based on the aforementioned, the important target of current industries is to develop a soldering structure having a thinner intermetallic compound. In particular, the soldering structure comprises a Co based diffusion barrier layer and a unique intermetallic compound.

SUMMARY OF THE INVENTION

In accordance with the present invention, a soldering structure particularly, to the soldering structure containing a Sn—Co—Fe intermetallic compound layer having a thickness less than 10 μm substantially obviates one or more of the problems resulted from the limitations and disadvantages of the prior art mentioned in the background.

The first objective in the present invention is to disclose a soldering structure comprises: a solder, a diffusion barrier layer and a Sn—Co—Fe intermetallic compound between the solder and the diffusion barrier layer, wherein the Sn—Co—Fe intermetallic compound having a thickness less than 10 μm.

In one embodiment, the solder is a lead free solder which is selected from the group consisting of Sn metal and Sn alloys.

In another embodiment, the diffusion barrier layer is a Co—Fe alloy consisting of 85~95 wt % of Co and 5~15 wt % of Fe. Preferably, the Co—Fe alloy consists of 90 wt % of Co and 10 wt % of Fe.

In still another embodiment, the Sn—Co—Fe intermetallic compound is $(Co,Fe)Sn_2$.

The soldering structure containing the Sn—Co—Fe intermetallic compound layer having a thickness less than 10 μm disclosed in the present invention is widely applied in electronic packaging industries, such as flip chip packaging.

Another objective of the present invention is to provide a process for making the soldering structure disclosed in the first objective. The process comprises: providing a solder which is selected from the group consisting of Sn metal and Sn alloys, providing a diffusion barrier layer which is a Co—Fe alloy consisting of 85~95 wt % of Co and 5~15 wt % of Fe and performing a step to have the solder react with the diffusion barrier layer at 250~300° C. to form the soldering structure containing a Sn—Co—Fe intermetallic compound between the solder and the diffusion barrier layer, wherein the Sn—Co—Fe intermetallic compound having a thickness less than 10 μm.

In one embodiment, the Co—Fe alloy consists of 90 wt % of Co and 10 wt % of Fe.

In one embodiment, the step to react the solder with the barrier diffusion barrier layer at 250~300° C. to form the soldering structure containing a Sn—Co—Fe intermetallic compound between the solder and the diffusion barrier layer comprises reflowing and step soldering.

In another embodiment, the Sn—Co—Fe intermetallic compound is $(Co,Fe)Sn_2$.

Still another objective of the present invention is to provide a method for reducing consumption of Co based diffusion barrier layers. The method is applied a Co—Fe alloy to be the diffusion barrier layers, wherein the Co—Fe alloy consisting of 85~95 wt % of Co and 5~15 wt % of Fe.

In one preferred embodiment, the Co—Fe alloy consists of 90 wt % of Co and 10 wt % of Fe.

Accordingly, the present invention discloses a soldering structure particularly, to a soldering structure containing a Sn—Co—Fe intermetallic compound layer having a thickness less than 10 μm and process of making the same. Also a method for reducing consumption of Co based diffusion barrier layers by applying the claimed Co—Fe alloy is provided.

BRIEF DESCRIPTION OF THE DRAWINGS

The accompanying drawings incorporated in and forming a part of the specification illustrate several aspects of the present invention, and together with the description serve to explain the principles of the disclosure. In the drawings.

DETAILED DESCRIPTION OF THE PREFERRED EMBODIMENTS

Figure 1:
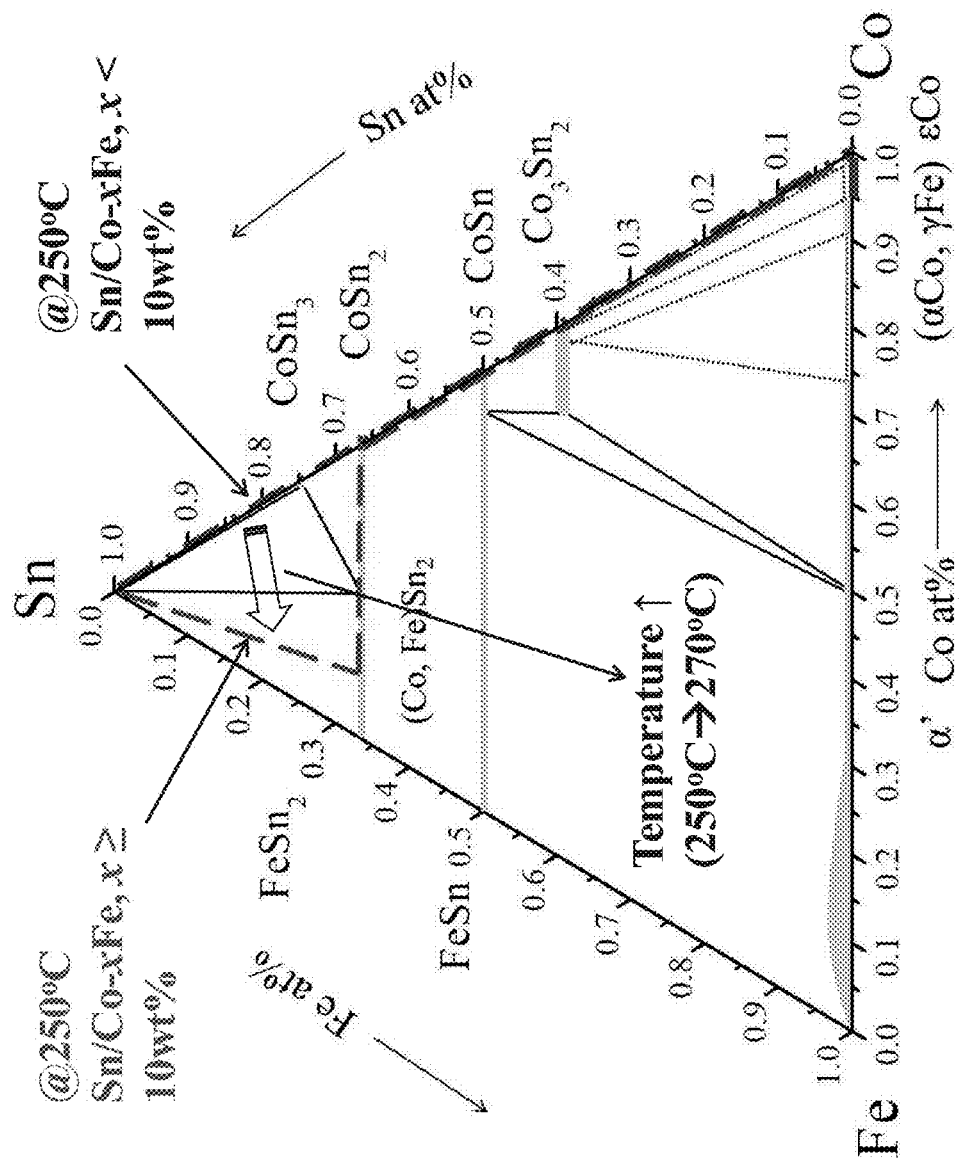
FIG. 1 shows reaction paths of Sn/Co-xFe alloys at 250° C.

What is probed into the invention is an amine modifying material and application thereof. Detail descriptions of the structure and elements will be provided in the following in order to make the invention thoroughly understood. Obviously, the application of the invention is not confined to specific details familiar to those who are skilled in the art. On the other hand, the common structures and elements that are known to everyone are not described in details to avoid unnecessary limits of the invention. Some preferred embodiments of the present invention will now be described in greater detail in the following. However, it should be recognized that the present invention can be practiced in a wide range of other embodiments besides those explicitly described, that is, this invention can also be applied extensively to other embodiments, and the scope of the present invention is expressly not limited except as specified in the accompanying claims.

In a first embodiment of the present invention, a soldering structure is disclosed. The soldering structure comprises a solder, a diffusion barrier layer and a Sn—Co—Fe intermetallic compound between the solder and the diffusion barrier layer, wherein the Sn—Co—Fe intermetallic compound having a thickness less than 10 μm.

In one example of the first embodiment, the solder is a lead free solder which is selected from the group consisting of Sn metal and Sn alloys.

In another example of the first embodiment, the diffusion barrier layer is a Co—Fe alloy consisting of 85~95 wt % of Co and 5~15 wt % of Fe. Preferably, the Co—Fe alloy consists of 90 wt % of Co and 10 wt % of Fe.

In still another example of the first embodiment, the Sn—Co—Fe intermetallic compound is $(Co,Fe)Sn_2$.

The soldering structure with a very thin intermetallic compound layer has excellent mechanical strength and good stability. Too thick intermetallic compound is detrimental to the soldering structure (i.e. soldering joints).

Accordingly, the aforementioned soldering structure containing the Sn—Co—Fe intermetallic compound layer having a thickness less than 10 μm is widely applied in electronic packaging industries, such as flip chip packaging.

In one example, the soldering structure disclosed in the first embodiment is part of an integrated circuit.

In one example, the soldering structure disclosed in the first embodiment is part of a liquid crystal display.

In one example, the soldering structure disclosed in the first embodiment is part of a printed circuit board.

In another example, the soldering structure disclosed in the first embodiment is part of a light-emitting diode device.

In another example, the soldering structure disclosed in the first embodiment is part of a portable communication device.

In still another example, the soldering structure disclosed in the first embodiment is part of a semiconductor.

In a second embodiment of the present invention, a process for making the soldering structure disclosed in the first embodiment is provided. The aforementioned process comprises: providing a solder which is selected from the group consisting of Sn metal and Sn alloys, providing a diffusion barrier layer which is a Co—Fe alloy consisting of 85~95 wt % of Co and 5~15 wt % of Fe, and performing a step to have the solder react with the diffusion barrier layer at 250~300° C. to form the soldering structure containing a Sn—Co—Fe intermetallic compound between the solder and the diffusion barrier layer, wherein the Sn—Co—Fe intermetallic compound having a thickness less than 10 μm.

In one example of the second embodiment, the Co—Fe alloy consists of 90 wt % of Co and 10 wt % of Fe.

In one example of the second embodiment, the step to react the solder with the barrier diffusion barrier layer at 250~300° C. to form the soldering structure containing a Sn—Co—Fe intermetallic compound between the solder and the diffusion barrier layer comprises reflowing and step soldering.

In another example of the second embodiment, the Sn—Co—Fe intermetallic compound is $(Co,Fe)Sn_2$.

In a third embodiment of the present invention, a method for reducing consumption of Co based diffusion barrier layers is disclosed. The method is applied a Co—Fe alloy to be the diffusion barrier layers, wherein the Co—Fe alloy consists of 85~95 wt % of Co and 5~15 wt % of Fe.

Co is effective in block Cu diffusion and used as a diffusion barrier layer in electronic packaging industries, such as flip-chip packaging. However, the interfacial reaction between Co and Sn solders is too fast so the diffusion barrier layer consume too quickly. The fast reaction rate of the pure Co diffusion barrier layer with the Sn solders also produces much thicker intermetallic compound layers. Thicker intermetallic compound layers have negative effects on the soldering structure (i.e. soldering joints). In contrast, when the diffusion barrier layer is a Co—Fe alloy having a specific weight percentage range of Fe, the reaction rate of the Co—Fe alloys with the Sn solders slow down significantly and the resultant Sn—Co—Fe intermetallic compound has a thickness less than 10 μm. The aforementioned Co—Fe alloy having a specific weight percentage range of Fe is a good material to be as a diffusion barrier layer in electronic packaging industries, such as flip chip packaging.

In one preferred example of the third embodiment, the Co—Fe alloy consists of 90 wt % of Co and 10 wt % of Fe.

In accordance with the foregoing summary, the following presents a detailed description of the example of the present invention, which is presently considered the best mode thereof. However, this invention can also be applied extensively to other embodiments, and the scope of this present invention is expressly not limited except as specified in the accompanying claims In order to analyze the intermetallic compound in the present invention, FIG. 1 is used to predict the reaction paths of Sn solder with Co—Fe alloys. According to FIG. 1, when Sn solders were reacted with Co-xFe alloy (x≥10 wt %) at 250° C., the reaction path is from liquid-state of Sn to $(Co,Fe)Sn_2$. On the other hand, Sn solders were reacted with Co-x Fe alloy (x<10 wt %) at 250° C., the reaction path is from liquid state of Sn to $CoSn_3$. Generally, the intermetallic compound layer was analyzed and characterized by X-ray diffraction technology.

Example 1

The Preparation of Co-xFe Alloys, where x is the Weight Percentage of Fe

The Co and Fe were first washed with dilute HCl, followed by mixing different weight percentage of Fe into Co and then forming the Co-x Fe alloys in a furnace. The Co-x Fe alloys were characterized by XRD, wavelength dispersive spectroscopy plus electron probe microanalysis (WDS-EPMA) or energy dispersive spectrometer plus scanning electron microscope (EDS-SEM).

Example 2

The Preparation of the Soldering Structure Disclosed in the Present Invention

Figure 2:
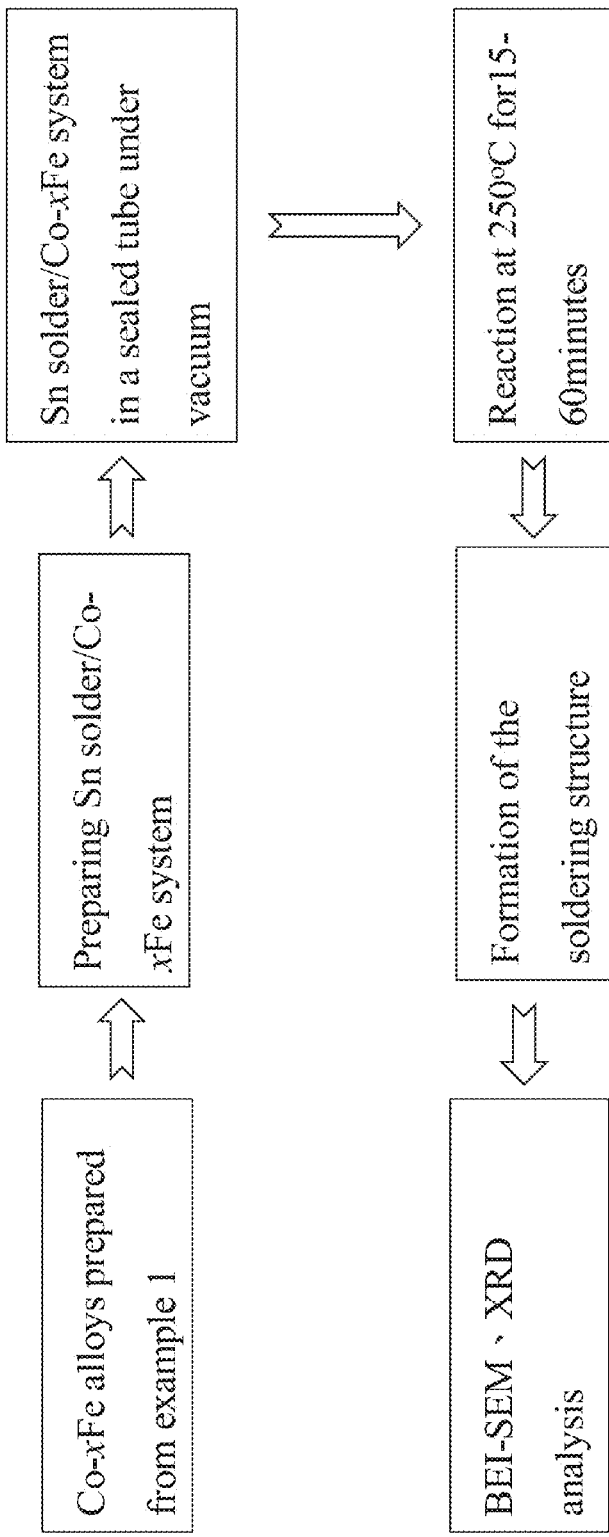
FIG. 2 shows the procedure described in example 2.
Figure 3:
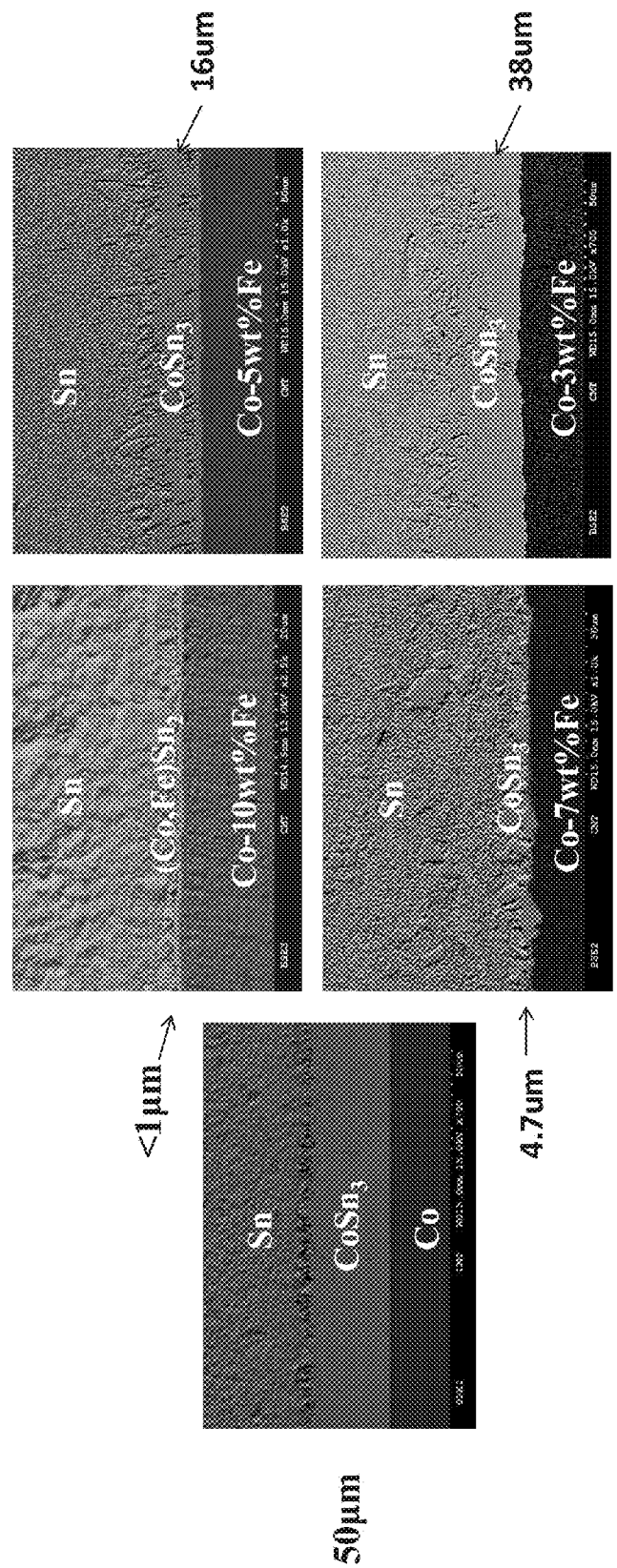
FIG. 3. shows the BEI-SEM images of the soldering structures prepared from the Sn/Co-xFe system at 250° C., where x is 0.3 wt %, 5 wt %, 7 wt % and 10 wt %, respectively.
Figure 4:
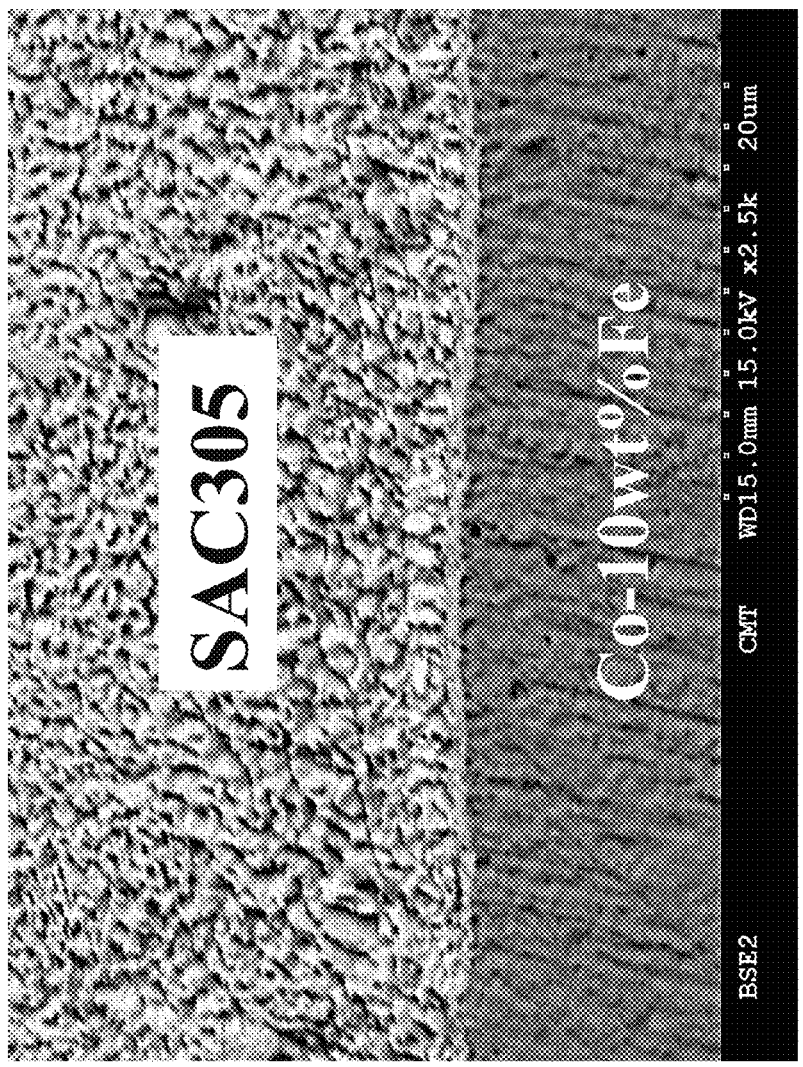
FIG. 4. shows the BEI-SEM image of the soldering structure prepared from SAC305/Co-10 wt % Fe system at 250° C.
Figure 5:
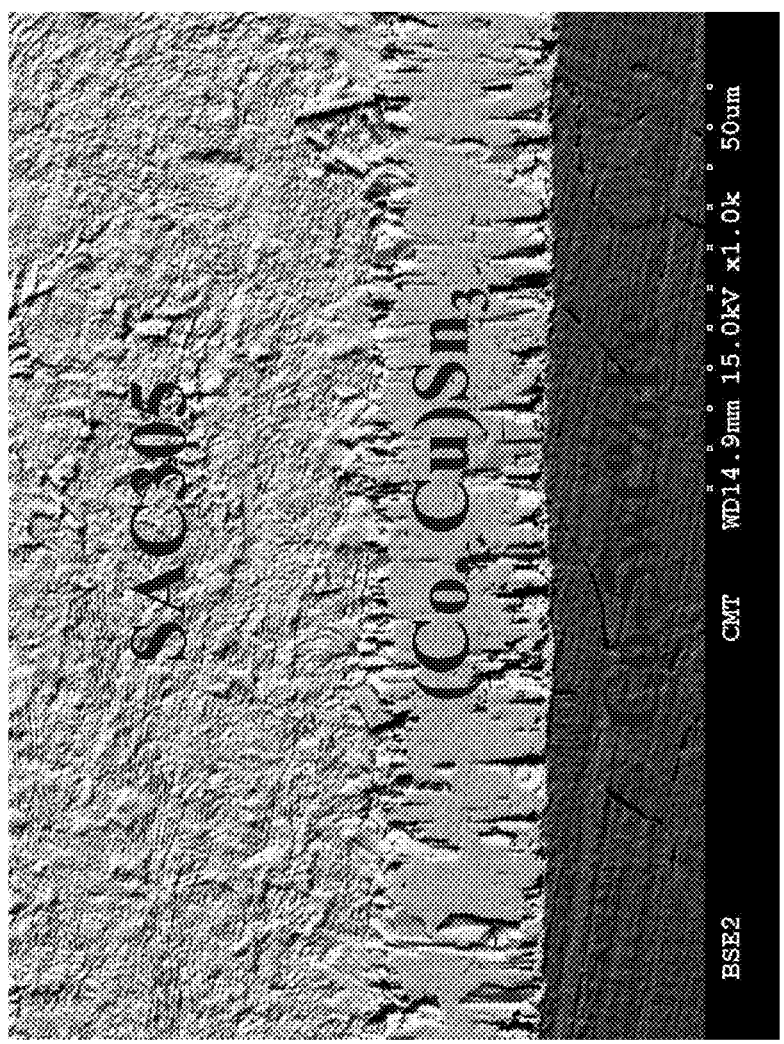
FIG. 5. shows the BEI-SEM image of the soldering structure prepared from SAC305/Co-5 wt % Fe system at 250° C.

According to FIG. 2, the Co-xFe alloys prepared from example 1 were first placed on a plate and then had the solder onto the Co-xFe alloys to form a solder/Co-xFe system. The solder/Co-xFe system was put into a quartz tube and then the quartz tube was sealed under vacuum. Put the sealed quartz tube into a furnace at 250° C. for 15~60 minutes to allow the formation of the soldering structure. After the preparation of the soldering structure, the intermetallic compound layer was analyzed by Backscattered Electron Image-Scanning Electron Microscopes (BEI-SEM). The BEI-SEM images are shown in FIG. 3, FIG. 4 and FIG. 5 and the thickness of the intermetallic compound layer was calculated by Equation I.

The Area of The Intermetallic Compound/The Length of The Intermetallic Compound        Equation I Soldering structures prepared from various solders/diffusion barrier layers system according to the procedure described in example 2 were investigated. The experimental data was summarized in Table I.

TABLE I

| Solder/ Diffusion barrier layer | Intermetallic Compound | Thickness(μm) |
|---|---|---|
| Sn/Co | $CoSn_3$ | 50.0 |
| Sn/Co-3 wt % Fe | $CoSn_3$ | 38.0 |
| Sn/Co-5 wt % Fe | $CoSn_3$ | 16.0 |
| Sn/Co-7 wt % Fe | $CoSn_3$ | 4.7 |
| Sn/Co-10 wt % Fe | $(Co, Fe)Sn_2$ | 0.7 |
| Sn/Co-10 wt % Ni | $(Co, Ni)Sn_3$ | 56.0 |
| SAC305/Co-5 wt % Fe | $(Co, Cu)Sn_3$ | 18.2 |
| SAC305/Co-10 wt % Fe | $(Co, Fe)Sn_2$ | <1 |

SAC305: Sn-3 wt % Ag-0.5 wt % Cu

According to Table I, as the soldering structure is prepared from Sn/Co system, the intermetallic compound is $CoSn_3$ with a thickness of 50 μm. In contrast, when the diffusion barrier layer is Co-10 wt % Fe, both of the soldering structure prepared from Sn/Co-10 wt % Fe and SAC-305/Co—10 wt % Fe have the same intermetallic compound $(Co,Fe)Sn_2$ with a thickness less than 1 μm. On the other hand, the soldering structure prepared from Sn/Co-10 wt % Ni system has an intermetallic compound with a thickness of 56 μm. As a result, Co—Fe alloys having a specific weight percentage range of Fe are ideal materials being as the diffusion barrier layer in the soldering structure.

Example 3

Aging Test

In order to evaluate the stability of the soldering structure prepared from Sn/Co-10 wt % Fe system, the aging test at different temperature 150° C. 180° C. and 210° C. were performed, respectively. The thickness of the intermetallic compound was measured at different time. The experimental data was shown in Table II. According to Table II, the thickness was still less than 10 μm after storage at 150° C. and 180° C. for 240 hours. It means the soldering structure prepared from Sn/Co-10 wt % Fe system is stable.

TABLE II

| | Time | | |
|---|---|---|---|
| Temp | 240 hr | 480 hr | 720 hr |
| 150° C. | 7.8 μm | 9.6 μm | 11.3 μm |
| 180° C. | 8.6 μm | 11.3 μm | 14.6 μm |
| 210° C. | 12.9 μm | 18.6 μm | 28.2 μm |

Example 4

Figure 6:
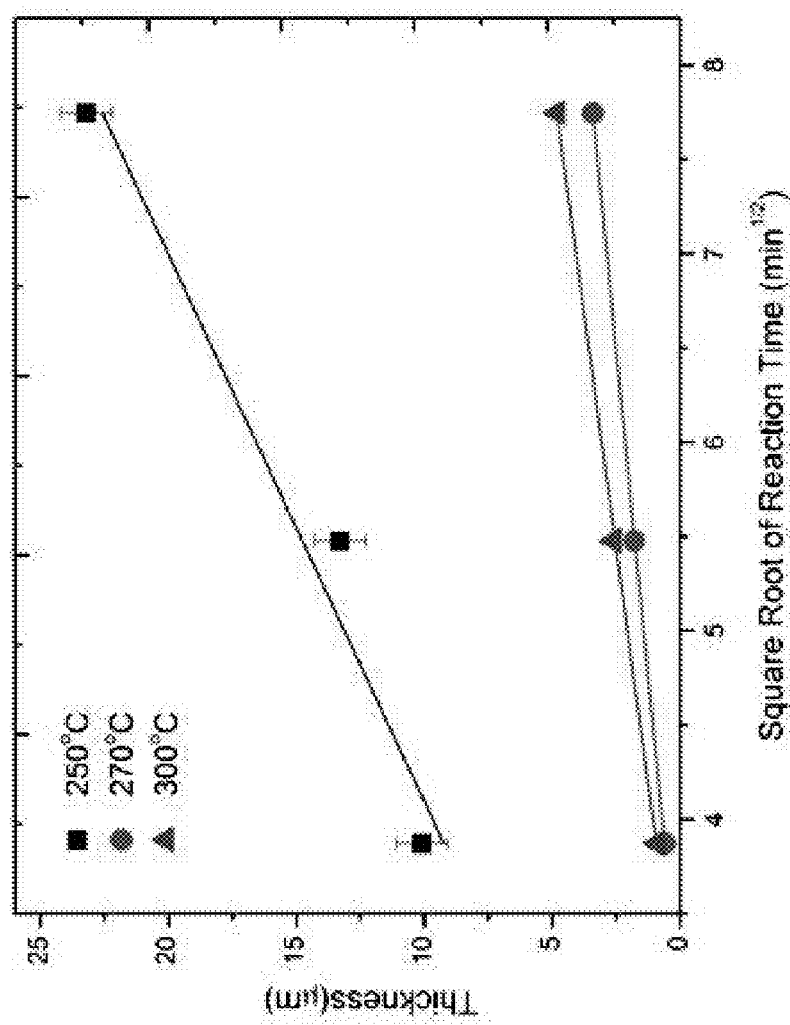
FIG. 6. shows the plot of intermetallic compound thickness vs. square root of reaction time according to example 4.

The Investigation of the Soldering Structure Prepared from Sn/Co-5 wt % Fe at Different Temperatures The procedure for preparing the soldering structures of example 4 is similar to example 2, only the reaction temperature was different. The experimental data was summarized in Table III. Additionally, the reaction rate between Sn and Co-5 wt % Fe at different temperatures is obtained from the slope of the line drawn in FIG. 6. According to Table III, the thickness of the intermetallic compound formed at 270° C. is much thinner than one formed at 250° C. That means Co-5 wt % Fe alloy is an ideal material being as the diffusion barrier layer in step soldering and removing process operated at a temperature higher than 250° C. Preferably, the operation temperature is 270° C.

TABLE III

| | Temp | | |
|---|---|---|---|
| Time | 250° C. | 270° C. | 300° C. |
| 1 hour | $CoSn_3$ | $(Co, Fe)Sn_2$ | $(Co, Fe)Sn_2$ |
| | 23.2 μm | 3.4 μm | 4.8 μm |
| rate constant (k m/s$^{1/2}$) | $4.5 \times 10^{-7}$ | $9.3 \times 10^{-8}$ | $1.3 \times 10^{-7}$ |

Although specific embodiments have been illustrated and described, it will be obvious to those skilled in the art that various modifications may be made without departing from what is intended to be limited solely by the appended claims.

What is claimed is:

1. A soldering structure, said soldering structure comprising: a solder, a diffusion barrier layer and a Sn—Co—Fe intermetallic compound layer between the solder and the diffusion barrier layer, wherein the Sn—Co—Fe intermetallic compound layer has a thickness less than 10 μm.

2. The soldering structure according to claim 1, wherein the solder is a lead free solder which is selected from the group consisting of Sn metal and Sn alloys.

3. The soldering structure according to claim 1, wherein the diffusion barrier layer is a Co—Fe alloy consisting of 85~95 wt. % of Co and 5~15 wt. % of Fe.

4. The soldering structure according to claim 3, wherein the Co—Fe alloy consists of 90 wt. % of Co and 10 wt. % of Fe.

5. The soldering structure according to claim 1, wherein the Sn—Co—Fe intermetallic compound layer is $(Co,Fe)Sn_2$.

6. The soldering structure according to claim 1, being part of an integrated circuit.

7. The soldering structure according to claim 1, being part of a liquid crystal display.

8. The soldering structure according to claim 1, being part of a printed circuit board.

9. The soldering structure according to claim 1, being part of a light-emitting diode device.

10. The soldering structure according to claim 1, being part of a portable communication device.

11. The soldering structure according to claim 1, being part of a semiconductor device.

12. A process for making the soldering structure according to claim 1, said process comprising:
    providing a solder which is selected from the group consisting of Sn metal and Sn alloys;
    providing a diffusion barrier layer which is a Co—Fe alloy consisting of 85~95 wt % of Co and 5~15 wt % of Fe; and
    performing a step to have the solder react with the diffusion barrier layer at 250~300° C. to form the soldering structure containing a Sn—Co—Fe intermetallic compound layer between the solder and the diffusion barrier layer, wherein the Sn—Co—Fe intermetallic compound layer has a thickness less than 10 μm.

13. The process according to claim 12, wherein the Co—Fe alloy consists of 90 wt % of Co and 10 wt % of Fe.

14. The process according to claim 12, wherein the Sn—Co—Fe intermetallic compound layer is $(Co,Fe)Sn_2$.

* * * * *